United States Patent [19]

Drake et al.

[11] 4,184,599
[45] Jan. 22, 1980

[54] PRINTED CIRCUIT BOARD STORAGE DEVICE

[76] Inventors: Leo O. Drake, Ridge La., Mill Neck, N.Y. 11765; Randall S. Drake, 85A Old Oak La., Levittown, N.Y. 11756

[21] Appl. No.: 924,074

[22] Filed: Jul. 12, 1978

Related U.S. Application Data

[63] Continuation-in-part of Ser. No. 844,758, Nov. 17, 1977, abandoned.

[51] Int. Cl.² .................... B65D 73/02; H02B 1/04
[52] U.S. Cl. ............................ 211/41; 206/334; 211/175; 211/188; 211/194; 361/415
[58] Field of Search .................. 211/10, 40, 41, 43, 211/175, 188, 194, 201; 361/397, 399, 412, 415, 420; 206/328, 511, 334, 454, 564

[56] References Cited

U.S. PATENT DOCUMENTS

| | | | |
|---|---|---|---|
| 888,855 | 5/1908 | Sisco | 211/41 |
| 1,010,801 | 12/1911 | Rapp | 206/511 |
| 3,014,594 | 12/1961 | Kerstner | 211/41 |
| 3,184,069 | 5/1965 | Rosenberg | 211/41 |
| 3,231,785 | 1/1966 | Calabro | 361/415 X |
| 3,490,603 | 1/1970 | Willer | 211/41 |
| 3,640,399 | 2/1972 | Hartman | 211/175 |
| 3,669,279 | 6/1972 | Burgard et al. | 211/41 |
| 3,714,513 | 1/1973 | Marconi | 211/41 X |
| 3,744,647 | 7/1973 | Jeliner | 211/175 |
| 4,092,699 | 5/1978 | Petrangelo | 361/415 |

FOREIGN PATENT DOCUMENTS

| | | | |
|---|---|---|---|
| 684282 | 4/1964 | Canada | 211/41 |
| 2604211 | 8/1977 | Fed. Rep. of Germany | 361/415 |
| 1189753 | 3/1959 | France | 211/411 |

*Primary Examiner*—Thomas J. Holko
*Attorney, Agent, or Firm*—Bauer & Amer

[57] ABSTRACT

A storage device for holding a plurality of printed circuit boards that is selectively adjustable for accommodating a wide dimensional range of circuit boards and adapted for stacking of a multiplicity of such devices for efficiently storing a large quantity of printed circuit boards in a minimum of space.

1 Claim, 6 Drawing Figures

PRINTED CIRCUIT BOARD STORAGE DEVICE

BACKGROUND OF THE INVENTION

This is a continuation-in-part of co-pending application Ser. No. 844,758, filed Nov. 17, 1977, now abandoned.

This invention relates to devices or cabinets for the storage of printed circuit boards.

In the current state of electronics technology, equipment is commonly constructed by mounting electronic and electromechanical components on series of insulative or dielectric plates. A metal conductive surface provided on one side of the plates is selectively etches in predetermined locations to provide electrical connections or paths between the various components located on the plate according to a schematic circuit and thereby complete an electrical circuit or subcircuit which forms at least a part of the device. These plates are generally known as printed circuit cards or boards.

The interconnection of the individual circuits contained on the cards is accomplished by suitable terminal sockets of the plug-in type into which connectors etched or otherwise provided on edges of the cards my be easily inserted. Where a large number of such printed circuit cards are interconnected to constitute the piece of equipment, the same may conveniently be configured as a rack or cage having retaining guides for accommodating the cards and for guiding the printed circuit boards into their respective plug-in terminal sockets and retaining the boards therein. Fabrication of a device by utilizing a plurality of printed circuit cards provides a number of significant advances, not the least of which includes the ability to update portions of the equipment merely by the substitution of more advanced printed circuit boards without the necessity of redesigning and rebuilding an entirely new piece of equipment.

The use of printed circuit boards is particularly advantageous in facilitating the rapid repair of malfunctioning electronic devices which include such circuit boards. The equipment may quickly be returned to service without removal from the operating site merely by unplugging and removing, one at a time, the printed circuit boards carrying the electronic circuits and subcircuits of the device and substituting for the board removed a like printed circuit card known to be properly functional. After each substitution is made, the equipment is tested to see if that particular substitution has resulted in repair of the device. Thus, the faulty printed circuit board may quickly and easily be isolated and the same thereafter returned to a testing laboratory or facility for repair. Accordingly, the technician in the field requires only minimal skills for the removal and substitution of printed circuit boards and as such need have little or no knowledge of the actual electronics within the equipment. This frees individuals having valuable technical skills from equipment troubleshooting in the field so as to enable them to more effectively utilize their time for circuit development and the like.

As a consequence, it is particularly advantageous to maintain a large supply of spare, properly functional printed circuit boards at locations where such boards are in constant use, such as telephone switching stations and the like. It is likewise often important to maintain a supply of printed circuit boards for performing alternative functions different from those normally performed by the operating equipment, as in a telephone office where a customer desiring additional features on his phone line may be accommodated merely by the substitution of a printed circuit board having the additional capabilities for the one formerly provided on the line without time-consuming and expensive rewiring.

Prior art circuit board supporting devices generally teach relatively complex channel-type edge retaining structures for the purpose of maintaining electrical contact with the circuit on the board by resiliently or otherwise retaining the printed circuit cards in guided contact with the plug-in type terminal sockets. Examples of this may be found in U.S. Pat. Nos. 3,723,823 to Lit et al and U.S. Pat. No. 4,022,326 to Marconi. The frames within which the edge retaining structures are mounted lack provision for dimensional adjustability to enable accommodation of all sizes of printed circuit boards commonly in use. The complexity of the edge retaining structures results in relatively high unit manufacturing costs which must be passed on to purchasing users of the articles. Because of this high cost, such users are reluctant to purchase these relatively expensive units merely for passive use in maintaining a supply of printed circuit boards not currently in use.

On the other hand, dimensionally adjustable printed circuit board retaining devices, such as that taught in U.S. Pat. No. 3,490,603 to Willer, provide insufficient strength and stability to enable large numbers of such devices to be stacked one atop the other for efficiently maintaining a large supply of printed circuit boards in a compact or limited area.

It is, therefore, the desideratum of the present invention to provide a device for the storage of a plurality of printed circuit boards which is dimensionally adjustable for accommodating a wide variety of sizes of circuit boards.

It is a further object of the present invention to provide such a device of particularly rugged construction that is stackably engageable with others of such devices for safely and efficiently storing a large quantity of printed circuit boards in a minimum of space.

It is another object of the present invention to provide such a device structurally configured to enable particular ease of insertion and removal of printed circuit boards.

Still another object of the present invention is to provide a storage device that is relatively low in cost and which may be readily manufactured utilizing well-known techniques.

Further objects, features and advantages of the present invention will be more fully appreciated by reference to the following detailed description of a presently preferred, but nonetheless illustrative embodiment in accordance with the present invention when taken in conjunction with the accompanying drawings, wherein:

FIG. 4 is a view, partly in section, of a portion of the height adjustment means of the present invention;

DETAILED DESCRIPTION OF THE PREFERRED EMBODIMENT

Figure 1:
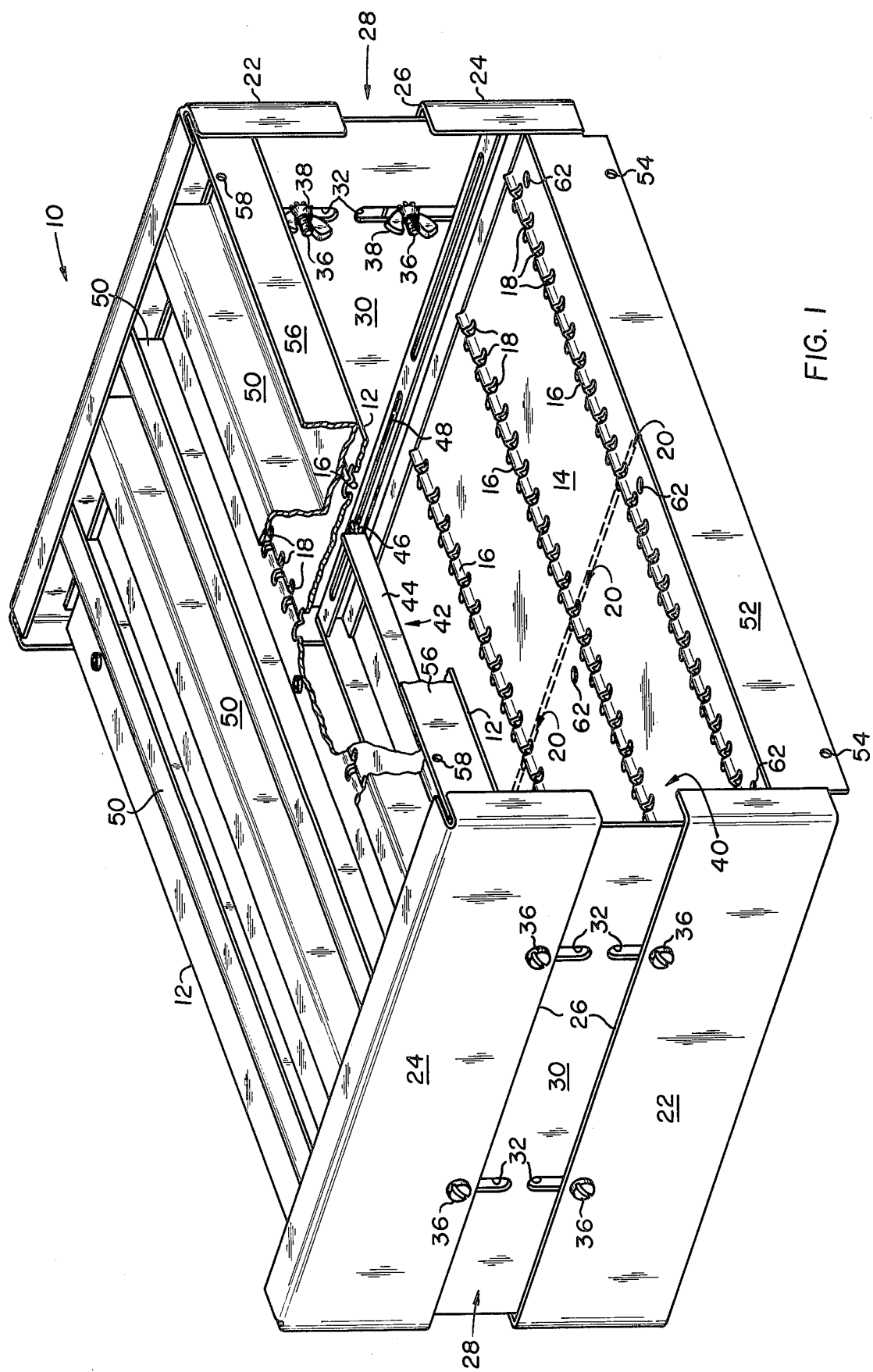
FIG. 1 is a perspective view, partially broken away, of a printed circuit board storage device constructed in accordance with the teaching of the present invention.
Figure 2:
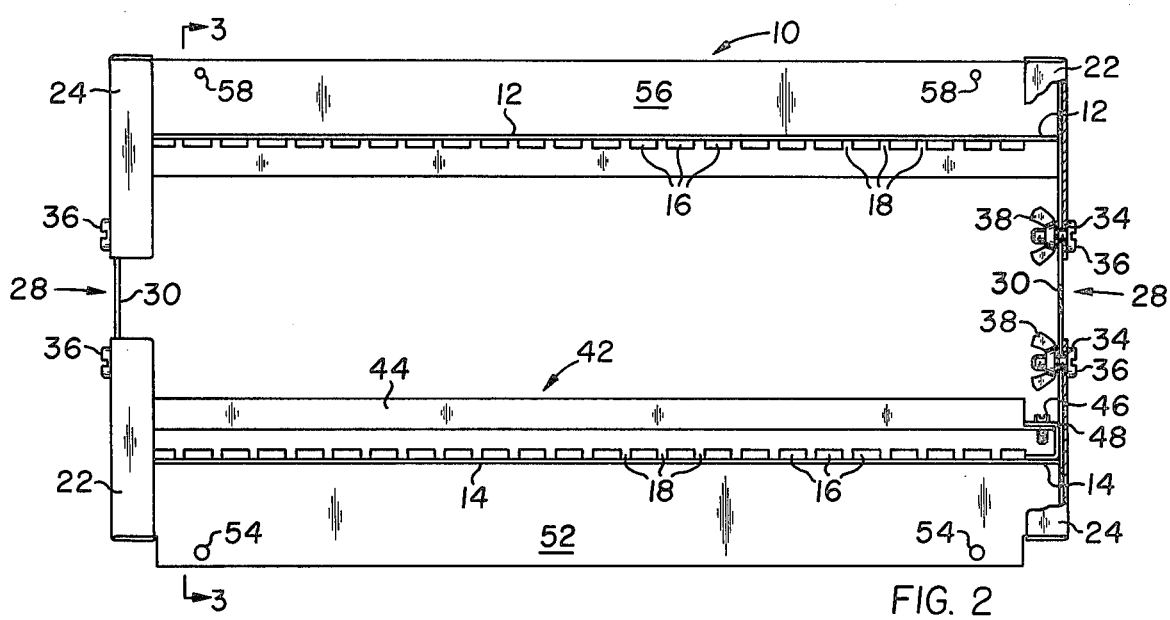
FIG. 2 is a front view, partially broken away, of the printed circuit board storage device of FIG. 1.
Figure 3:
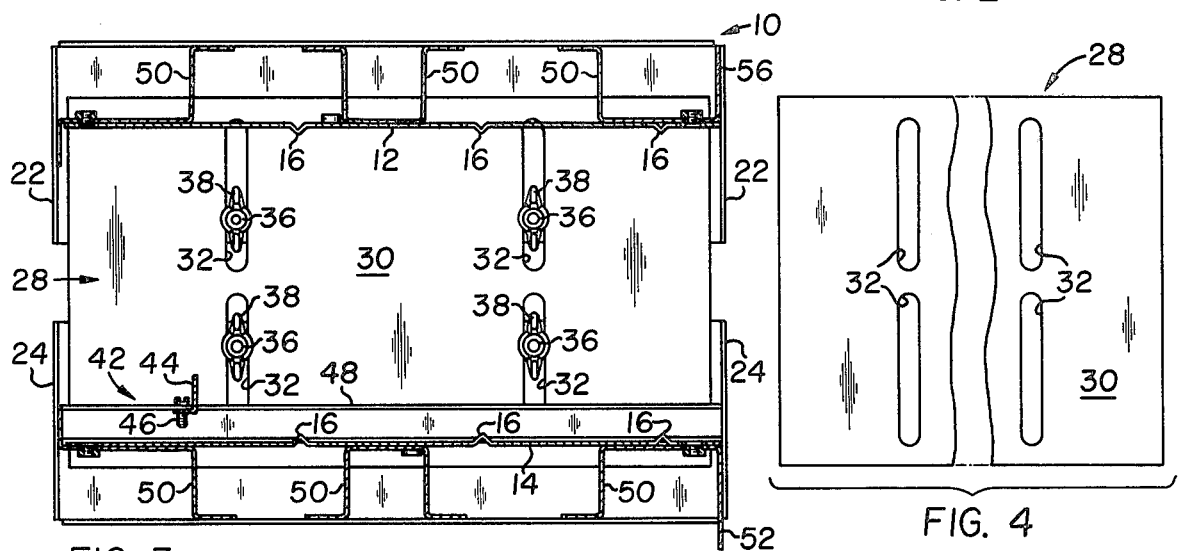
FIG. 3 is a side view of the storage device of FIG. 2 taken along the lines 3—3.

Turning now to the drawings, there is shown in FIGS. 1 through 3 a preferred embodiment of a printed circuit board storage device or cabinet constructed in accordance with the present invention for holding a plurality of circuit cards or boards in substantially parallel spaced relationship. The storage device, designated by the general reference numeral 10, comprises a pair of substantially parallel and opposed upper and lower support members or surfaces 12 and 14, respectively, spaced apart a selectively adjustable distance as will soon be described.

The members 12, 14 are substantially flat and may be rectangular as shown although their actual configuration or shape is not meant to constitute a limitation on the present invention. Each of the support surfaces 12, 14 carries a plurality of upstanding elongated ribs or ridges 16 substantially along the elongation of the surface and preferably integral therewith, the ribs 16 being arranged in spaced apart and substantially parallel relation to one another. The height of the ribs 16 above the flat face of each of the members 12, 14 is not critical although a rib height of approximately 3/16 inches has been found to be satisfactory and is, therefore, preferred.

Defined in each of the ribs 16 are a plurality of grooves or slots 18 of predetermined width disposed substantially normally to the direction of elongation of the ribs. As will become clear, the width of the grooves 18 should be slightly greater than the thickness of typical printed circuit cards to be stored in the device 10. A groove width of approximately 3/16 inches is sufficient for the great majority of circuit boards currently in use.

The spacing between adjacent ones of the groove 18 is preferably substantially constant and the grooves 18 in adjacent ribs 16 are so aligned as to define substantially parallel edge receiving channels for engaging side or edge portions of stored printed circuit boards. One of the edge receiving channels is designated in FIG. 1 by the general collective reference numeral 20 and shown therein in dotted lines for purposes of illustration. Corresponding oppositely positioned edge receiving channels 20 in the respective parallel opposed members 12, 14 are similarly aligned to enable the support of printed circuit boards between the support members 12, 14 and within the respectively opposed and aligned edge receiving channels 20. Thus, printed circuit cards and upstandingly held in the storage device 10 substantially perpendicularly between the opposed surfaces 12, 14 such that the edges of the circuit cards are supported on the flat surfaces 12, 14 and portions of the card edges are confined within the bounds of the aligned grooves 18 to prevent lateral movement of the circuit cards out of the edge receiving channels 20. The circuit cards are maintained essentially parallel and spaced from one another an amount substantially equal to the spacing between adjacent grooves 18 so as to prevent possibly deleterious or damaging contact between adjacently stored circuit boards as the same are inserted into or removed from within the storage device 10.

Each of the support members 12, 14 carries a pair of substantially perpendicular side portions 22, 24 depending or supported from its opposite ends in the direction of the elongation of the ribs 16. The side portions 22, 24 are located and arranged to enable cooperative engagement between each one of the side portions 22, 24 on one of the support members 12, 14 and a mutually oppositely disposed one of the side portions 22, 24 on the other of the support members. Thus, as seen in the drawings, the side portion 22 of the lower support member 14 is arranged for engagement with the side portion 24 of the upper member 12 and the side portion 24 of lower member 14 is juxtaposed for engagement with the side portion 22 of upper member 12. Each of the side portions 22, 24 is provided with a contact edge 26 for abutment with an oppositely disposed edge 26 to complete or form substantially unitary and continuous opposed sidewalls connecting the opposed support members 12, 14 when the adjustable spacing between the members 12, 14 is at a minimum distance as will become clear hereinafter.

An adjustable means generally designated 28 is provided between each of the mutually oppositely disposed side portions 22, 24 for connecting the same and enabling the adjustable selection of the spacing between the opposed support members 12 and 14. Adjustable means 28 is arranged to provide the ability to continuously vary the spacing between the opposed members 12, 14 from a minimum to a maximum position and therebetween while insuring that throughout the adjustment range the corresponding opposed edge receiving channels 20 in the support members 12, 14 are at all times maintained mutually opposed and parallel with each other for supported retention of printed circuit boards therebetween.

Adjustable means 28 comprises a substantially flat adjustment plate 30 engageable between each pair of mutually oppositely disposed side portions 22, 24. As seen in FIG. 4, each adjustment plate 30 includes a plurality of parallel elongated slots 32 defined therethrough to provide for adjustable connection with the side portions 22, 24. For this purpose, each side portion includes bores 34 cooperatively positioned thereon for alignment with corresponding slots 32 on said adjustment plate 30 to define an alignment passageway for each bore 34 and slot 32 cooperating pair.

In order to complete the connection between each of the adjustment plates 30 and the cooperating side portions 22, 24, a screw 36 is journalled through each alignment passageway and a hand rotatable wing nut 38 or the like is threaded thereon to enable retention of the screws 36 in the passageways. The paired combinations of screws 36 and wing nuts 38 constitutes a locking means for maintaining the selected adjustment of the spacing between the opposed support members 12, 14.

To adjust the spacing between the support members 12, 14, the locking means is first loosened or disengaged by rotating at least some of the wing nuts 38 relative to their cooperatively engaging screws 36. This unlocking action enables movement of the mutually oppositely disposed side portions 22, 24 relative to each other and relative to the connecting adjustment plate 30. After adjustment of the amount of separation between the opposed support members 12, 14 to conform to the relevant dimension, as for example the width, of the printed circuit cards to be stored in the device 10, the locking means are tightened by rotating the wing nuts 38 relative to the engaging screws 36 so as to prevent any change in such spacing or separation during use of the storage device 10.

When the locking means is loosened or disengaged, the relative positions of the mutually engageable side portions 22, 24 are continuously variable from minimum to maximum spaced apart positions of the support members 12, 14 as the screws 36 ride in and are guided along the elongations of the slots 32 of the adjustment plate 30. In the minimum position the contact edges 26 of the mutually oppositely disposed side portions 22, 24 are preferably positioned in substantial abutment with one another to complete substantially unitary and continuous opposed sidewalls connecting the support members 12, 14. Each adjustment plate 30 is disposed fully inwardly of the side portions 22, 24 so as to be concealed by the abutting side portions 22, 24 when viewing the storage device 10 from the outside thereof. In the maximum spaced apart position, on the other hand, the mutually oppositely disposed side portions 22, 24 are relatively separated from the minimum position of substantial abutment and the adjustment plates 30 may be seen to connect the pairs of mutually opposed side portions 22, 24 to join the same and form continuations thereof to complete relatively continuous sidewalls between the support members 12, 14.

The connection of each pair of mutually oppositely disposed side portions 22, 24 through and with the adjustment plate 30 cooperates with the opposed support members 12, 14 to boundingly define a tubular or tunnel-like enclosure open at opposite ends. As will become clear, however, in use only a single open end 40 (which may be seen as the front end of the device 10 in FIGS. 1 and 2) is necessary to permit insertion and removal of printed circuit boards or cards from within the device 10 and consequently it is anticipated that the opposite or rearwardly disposed end may be fully or partially closed (not shown), as for example with a covering plate or member or the like.

It can, therefore, be appreciated that printed circuit cards may be stored in the device 10 merely by inserting the cards in a vertical or upstanding position through the open end 40 for guided support in mutually oppositely disposed edge receiving channels 20. The printed circuit boards are retained in parallel, spaced relationship with one another substantially perpendicularly between the opposed surfaces or members 12, 14 and are prevented from lateral or side-to-side movement as a result of the positioning of side portions of the circuit boards within the cooperatively aligned grooves 18.

A restraining or stop means generally designated 42 is provided cooperatively on the lower or bottom support member 14 to adjustably stop the inwardly directed movement of printed circuit boards inserted into the device 10 through the open end 40 at a selected position within the enclosure. By limiting this distance of circuit board insertion into the storage device 10, the boards are prevented from being overinserted such that the same are caused to pass completely through the device 10 and be forced out of the enclosure through the back or rearwardly disposed open end. In addition, where all of the circuit boards to be stored in the device 10 are of substantially the same size, the adjustability of the stop means permits the alignment of the outwardly facing edges of the boards so as to present a neat and attractive appearance.

The stop means 42 comprises an elongated restraining bar 44 which may be L-shaped as shown or otherwise conveniently configures as desired. The bar 44 extends for substantially the entire length of the printed circuit board storage enclosure and may be releasably connected as by screws 46 or the like to an adjustment track means 48 along which the bar 44 is relatively slidable for adjustment of the depth to which printed circuit cards may be inserted into the device 10. The track means 46 may be carried on the lower support surface 14 and raised therefrom as shown in the drawings or the same may alternatively depend from the upper surface 12 or from the side portions 22, 24. If the storage of printed circuit cards of varying lengths is desired, the restraining bar 44 may be stepped (not shown) rather than straight so as to allow circuit cards inserted into different portions of the enclosure to reach different depths therein depending upon the position of the corresponding portion of the restraining bar 44.

To increase the structural strength and rigidity of the storage device 10, a plurality of substantially U-shaped members 50 may be provided on the outwardly disposed faces of the support members 12, 14 so as to form a generally corrugated structure thereon. The inclusion of the U-shaped members 50 effects a significant increase in the rigidity of the support members 12, 14 to prevent substantial deformation thereof and maintain the selected spacing between the opposed support members 12, 14 regardless of outside forces acting upon the device 10. As a consequence, the resulting inherent structural stability and strength enables a plurality of the storage devices 10 to be stacked one atop another so as to provide for safe and efficient storage of a large quantity of printed circuit boards in a relatively compact area.

Stacking of a plurality of the devices 10 is facilitated by the inclusion in each device 10 of a bottom flange 52 normally depending from the lower support member 14 in a direction outwardly of the enclosure. A plurality of apertures 54 are defined in the flange 52 which is preferably located adjacent the enclosure open front end 40 for enabling unrestricted and convenient access thereto.

Cooperating means, which may for example take the form of a similarly configured upper flange 56 normally outwardly depending from the top support surface 12, may be provided on the storage device 10 for engagement with a bottom flange 52. Thus, for the purpose of stacking two of the storage devices 10 shown in the drawings, the bottom flange 52 of one of the devices, which flange 52 is seen to extend beyond the lowermost edge of the side portions 22, 24, is adapted to engage in overlapping relation atop the upper flange 56 of the other device 10. The two storage devices 10 may be secured and retained in this stacked position one atop the other so as to prevent substantial relative motion therebetween by the use of screws or the like journalled through each of the bottom flange apertures 54 and correspondingly positioned holes 58 on the upper flange 56.

Figure 5:
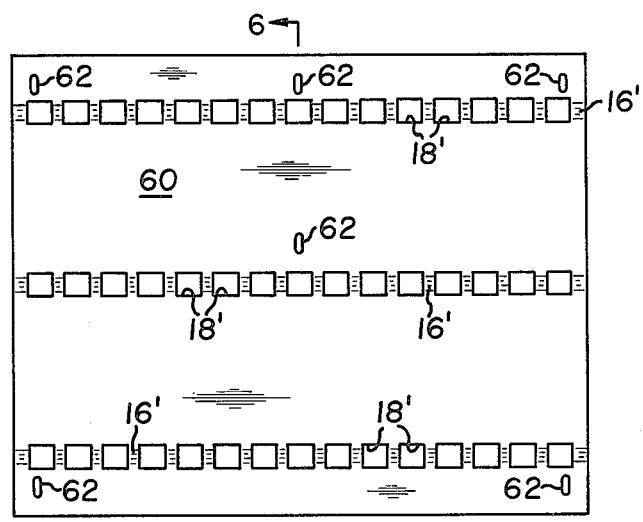
FIG. 5 is a plan view of an auxiliary printed circuit board support plate for use with the embodiment of FIG. 1 of the present invention.
Figure 6:
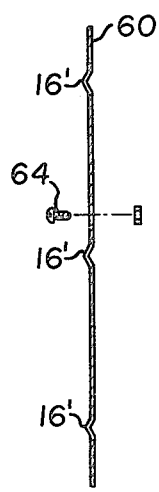
FIG. 6 is an end view of the guide plate of FIG. 5 taken along the lines 6—6.

At times the thickness of the printed circuit boards to be stored may be greater than the predetermined width of the channel defining grooves 18 on the support members 12, 14. A pair of auxiliary support members 60 may thus be utilized to enable retention of the extra-thick circuit boards in the storage device 10. As seen in FIGS. 5 and 6, each auxiliary support member 60 comprises an essentially flat plate having integral ribs 16' substantially conforming in configuration and location to that of the support members 12, 14.

Inasmuch as the structural details of the auxiliary members 60 are substantially the same as those previously disclosed with regard to the support members 12, 14, discussion of these common details would be redundant and superfluous and is, therefore, omitted. However, the grooves 18' defined in the ribs or ridges 16' of the auxiliary supports 60 may be seen to be wider than those provided on the support members 12, 14 to permit the receipt of thicker printed circuit cards in the grooves 18' than in the grooves 18. Of course, those skilled in the art will readily appreciate that the width of the grooves 18' in the members 60 could alternatively be configured more narrowly than the width of the grooves 18 on the support members 12, 14 to enable the device 10 utilizing the auxiliary members 60 to store thinner or more narrow cards while preventing lateral movement thereof.

As a consequence of the substantially conforming configurations of the auxiliary members 60 and the support members 12, 14, a member 60 may be positioned abuttingly atop each of the support members 12 and 14 to substitute as supporting surfaces for the stored printed circuit cards. The auxiliary members 60 are preferably engageable on the members 12, 14 to prevent movement of the members 60 relative to the underlying support members 12, 14. Connecting means, as for example a plurality of aligned apertures 62 on each of the auxiliary members 60 and support surfaces 12, 14 for receipt of screws 64 of the like, may be provided for this purpose.

It can, therefore, be appreciated that the printed circuit card storage device 10 of the present invention provides an unusually simple and yet tremendously versatile structure utilizing a minimum of parts adjustably interconnected for accommodating a wide variety of various sizes of printed circuit boards. It is contemplated that variations in the structural details herein disclosed may be made within the scope of the invention.

Likewise, the dimensions and configurations of particular members or portions of the device 10 may be selected within the teaching of the present invention to suit particular application requirements or design choices. For example, the sizing of the adjustment plates 30 and the positioning and elongation of the slots 32 thereon will significantly affect the maximum extendible size of the storage device 10 and the minimum closure thereof. The plates 30 can, if desired, be sized such that the minimum spacing between the support members 12, 14 is too large to permit the above-described abutment of the side portion edges 26. Thus, utilizing the same support members 12, 14 having integral depending side portions 22, 24, the dimensional range of printed circuit cards that may be stored in the device 10 may be greatly altered merely by the substitution of differently sized adjustment plates 30.

While there have been shown and described and pointed out the fundamental novel features of the invention as applied to a preferred embodiment thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

What is claimed is:

1. In a storage cabinet for printed circuit cards,
   top and bottom opposed substantially parallel support surfaces spaced apart a selected distance for releasably retaining a plurality of printed circuit cards disposed substantially normal therebetween,
   a pair of opposed sidewalls depending from said top and bottom surfaces and connecting the same so as to define a tunnel-like enclosure having oppositely disposed open ends between said sidewalls and bounded by edges of said surfaces and sidewalls such that the printed circuit cards may be inserted into said enclosure through one of said open ends for assuming an upstanding stored position substantially normal between said open ends,
   adjustable means on each of said sidewalls for selectively varying the distance between said top and bottom surfaces for the purpose of adjusting the same to the upstanding dimensions of printed circuit cards to be stored in said cabinet,
   said top and bottom surfaces being substantially flat and having a plurality of elongated integrally defined upstanding ribs directed into the interior of said enclosure and positioned between and substantially parallel to the planes of said oppositely disposed open ends, each of said ribs including a plurality of grooves defined therein to interrupt the continuity thereof and being perpendicular to the direction of elongation of said ribs for receiving in said grooves edge portions of the printed circuit cards for the purpose of retaining the cards in said upstanding stored position between said opposed top and bottom surfaces,
   and adjustable stop means on at least one of said surfaces for selectively limiting the insertion of the printed circuit cards into said enclosure so as to prevent the overinsertion of the cards into the enclosure through said one open end and out of the enclosure through said opposite open end,
   said plural grooves are of a predetermined width slightly larger than the thickness of the printed circuit cards to be stored in said cabinet,
   auxiliary support means for guiding and retaining in said cabinet a plurality of printed circuit cards of a thickness greater than the width of said grooves, said auxiliary means being engageable on each of said top and bottom opposed surfaces and comprising a pair of substantially flat plates each having a plurality of upstanding elongated ridges thereon, said ridges including a plurality of slots of predetermined width greater than the width of said grooves defined substantially normal to the direction of elongation of said ridges,
   and engaging means on said opposed surfaces and on said flat plate auxiliary support means for connecting said flat plates with said opposed surfaces for supporting printed circuit cards of a different thickness between said flat plates than the printed circuit cards supported between said opposed surfaces.

* * * * *